United States Patent [19]
Tomita et al.

[11] Patent Number: 5,896,347
[45] Date of Patent: Apr. 20, 1999

[54] SEMICONDUCTOR MEMORY SYSTEM USING A CLOCK-SYNCHRONOUS SEMICONDUCTOR DEVICE AND SEMICONDUCTOR MEMORY DEVICE FOR USE IN THE SAME

[75] Inventors: Hiroyoshi Tomita; Yoshihiro Takemae, both of Kawasaki, Japan

[73] Assignee: Fujitsu Limited, Kawasaki, Japan

[21] Appl. No.: 08/925,458

[22] Filed: Sep. 8, 1997

[30]   Foreign Application Priority Data

Dec. 27, 1996 [JP]  Japan ................................ 8-351548

[51] Int. Cl.$^6$ ....................................... G11C 8/00
[52] U.S. Cl. ...................... 365/233; 365/189.05; 365/194
[58] Field of Search ............................ 365/233, 230.03, 365/189.05, 194

[56]   References Cited

U.S. PATENT DOCUMENTS

| | | | |
|---|---|---|---|
| 5,371,715 | 12/1994 | Kim . | |
| 5,479,646 | 12/1995 | Proebsting . | |
| 5,627,795 | 5/1997 | Nitta | 365/233 |
| 5,694,371 | 12/1997 | Kawaguchi | 365/233 |
| 5,715,198 | 2/1998 | Braceras et al. | 365/189.05 |
| 5,767,715 | 6/1998 | Marquis et al. | 365/233 X |

FOREIGN PATENT DOCUMENTS 2 296 591   7/1996   United Kingdom .

*Primary Examiner*—Huan Hoang
*Attorney, Agent, or Firm*—Nikaido, Marmelstein, Murray & Oram LLP

[57]   ABSTRACT

A semiconductor memory system using a synchronous memory and operating at a higher speed due to a reduced margin required when reading data from the SDRAM, and a semiconductor memory device for achieving the same are disclosed. The semiconductor memory system comprises at least one semiconductor memory device and a control device for performing data input/output to and from the semiconductor memory device, wherein the control device outputs data to be stored in the semiconductor memory device, synchronously with a first synchronizing signal that the control device outputs, and the semiconductor memory device delivers output data therefrom synchronously with a second synchronizing signal that the semiconductor memory device outputs. In the thus constructed semiconductor memory system, the semiconductor memory device incorporates an output phase shift circuit which introduces a prescribed phase angle between the output data and second synchronizing signal, and provisions are made so that at the semiconductor memory device side the output data and the second synchronizing signal are controlled precisely at the prescribed phase angle with respect to each other, and so that a latch pulse can be immediately generated at the controller side upon reception of a data strobe signal.

21 Claims, 18 Drawing Sheets

| STATE | P | Q | OPERATION |
|---|---|---|---|
| a | L | L | DELAY AMOUNT INCREASES |
| b | L | H | HOLD |
| c | H | H | DELAY AMOUNT DECREASES |

SEMICONDUCTOR MEMORY SYSTEM USING A CLOCK-SYNCHRONOUS SEMICONDUCTOR DEVICE AND SEMICONDUCTOR MEMORY DEVICE FOR USE IN THE SAME

BACKGROUND OF THE INVENTION

1. Field of the Invention

The present invention relates to a synchronous semiconductor memory device (synchronous memory) which operates synchronously with an externally input signal, and more particularly to a synchronous memory which outputs a data strobe signal and delivers output data synchronously with the data strobe signal so as to facilitate the construction of a high-speed semiconductor memory system.

2. Description of the Related Art

Usually, a semiconductor integrated circuit (LSI circuit) receives an external signal as an input and produces an output signal by performing operations appropriate to the input signal. The timing at which the output signal will be obtained in response to the external input signal is important; for general purpose LSIs, such timing is usually defined in their specifications. For example, for dynamic random access memories (DRAMs), the timing for data output relative to a changing edge of an address signal and the data setup time required to write data are specified along with the maximum frequency of the address signal, etc.

In recent years, with increasing CPU clock speeds in computer systems, or with increasing processing speeds of various electronic circuits, it has become imperative to develop higher-speed interfaces. For example, CPUs with 100 MHz or higher clock speeds are available, but compared with the CPU speeds, the access speed and data transfer speed of DRAM widely used as main memory are an order of magnitude slower. To address this situation, a variety of DRAM systems such as synchronous DRAM (SDRAM) have been proposed that achieve data transfer rates of 100 MHz or higher.

The SDRAM performs data input/output operations synchronously with an externally input high-speed clock, and incorporates a plurality of units to enable multi-bit data to be input and output in parallel. High-speed interfacing with an external device is achieved by a method in which the multi-bit data are converted into serial data, or by a method in which internal operations are pipelined and the operations in the pipes are carried out in parallel, or by a combination of these two methods.

Traditional SDRAMs operate synchronously with a clock CLK supplied from a controller, and when writing data to SDRAM, the write data is latched into the SDRAM by operating its latch circuit for latching the write data or address sent from the controller, synchronously with the received clock. Likewise, when reading data from SDRAM, the read data is output from the SDRAM by operating its data output circuit for outputting data read out of an internal memory cell, synchronously with the received CLK. The signals sent from the controller to the SDRAM do not pose any problems since they are sent along substantially the same signal path as the CLK and therefore, a phase shift (skew) with respect to the CLK can be minimized, but a problem can arise when sending readout data from the SDRAM to the controller; that is, even if the SDRAM outputs the data synchronously with the received CLK, since the data is sent in the opposite direction to the CLK, there occurs a skew between the CLK and the readout data by the time the data is received at the controller. Such a skew has not been much of a problem for previous SDRAMs having relatively slow operating speeds, but this skew cannot be ignored when constructing a memory system using an SDRAM operating at a speed higher than 100 MHz. In view of this problem, it has been proposed to have the SDRAM output a data strobe signal DS and deliver readout data synchronously with this DS. The above skew problem can be alleviated by configuring the controller to operate its readout data latch circuit synchronously with the received DS and thereby latch the data into the controller.

However, the skew cannot be eliminated completely since actually there exist slight differences in wiring and also differences between wiring patterns for multi-bit data DQ. Furthermore, the pulse used to latch data into the data latch circuit must be provided with a minimum required width, and there also exist differences in the layout of the plurality of multi-bit data lines within the controller, in wiring length, and even in leadframe length. All of these factors contribute to increasing the skew. On top of that, when a delay circuit is used in the controller, not only manufacturing variations among chips but differences in temperature and supply voltage also cause variations. Overall, a large margin has to be allowed, and this determines the limit of the operating speed of SDRAM. Therefore, to achieve a high-speed SDRAM, this operating margin must be reduced.

SUMMARY OF THE INVENTION

An object of the present invention is to provide a semiconductor memory system using a synchronous memory and operating at a higher speed by reducing the margin required when reading data from the SDRAM, and a semiconductor memory device for achieving the same.

According to the semiconductor memory system and semiconductor memory device of the present invention, the semiconductor memory device incorporates an output phase shift circuit which introduces a prescribed phase angle between output data and data strobe signal, and provisions are made so that at the semiconductor memory device side the output data and the data strobe signal are controlled precisely at the prescribed phase angle with respect to each other, and so that a latch pulse can be immediately generated at the controller side upon reception of the data strobe signal. This configuration serves to obviate the need for a delay circuit as required in the prior art and, accordingly, to eliminate that portion of the margin which had to be allowed for the variations due to manufacturing variations of the delay circuit and differences in temperature and supply voltage.

As already described, it is desirable that the data strobe signal has a 50% duty cycle, and the data output is performed twice during one cycle of the data strobe signal. In this case, if the phase of rising edge of the data strobe signal is considerate to be 0 degree, the output data changes at 90 and 270 degrees of the data strobe signal.

It is also desirable that the output phase shift circuit be configured to be capable of adjusting the phase difference between the output data and data strobe signal to a plurality of set values so that the circuit can be used with various types of controller, and that the values can be set from the controller. In that case, a mode register must be provided to store a plurality of control values corresponding to the plurality of phase difference values defining the phase difference between the output data and the data strobe signal, and to select and output one of the control values in response to a command signal from the controller, and the output phase shift circuit must be able to adjust the phase difference based on the control value output from the mode register.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before proceeding to a detailed description of the preferred embodiments of the present invention, a semiconductor memory system including a plurality of synchronous DRAMs will be described for a better understanding of the present invention. The embodiments in which the present invention is adapted to a synchronous DRAM will be described later. As mentioned previously, the present invention is not limited to the synchronous DRAM but can be applied to any semiconductor integrated circuit for receiving a signal synchronously with an externally input signal.

Figure 1:
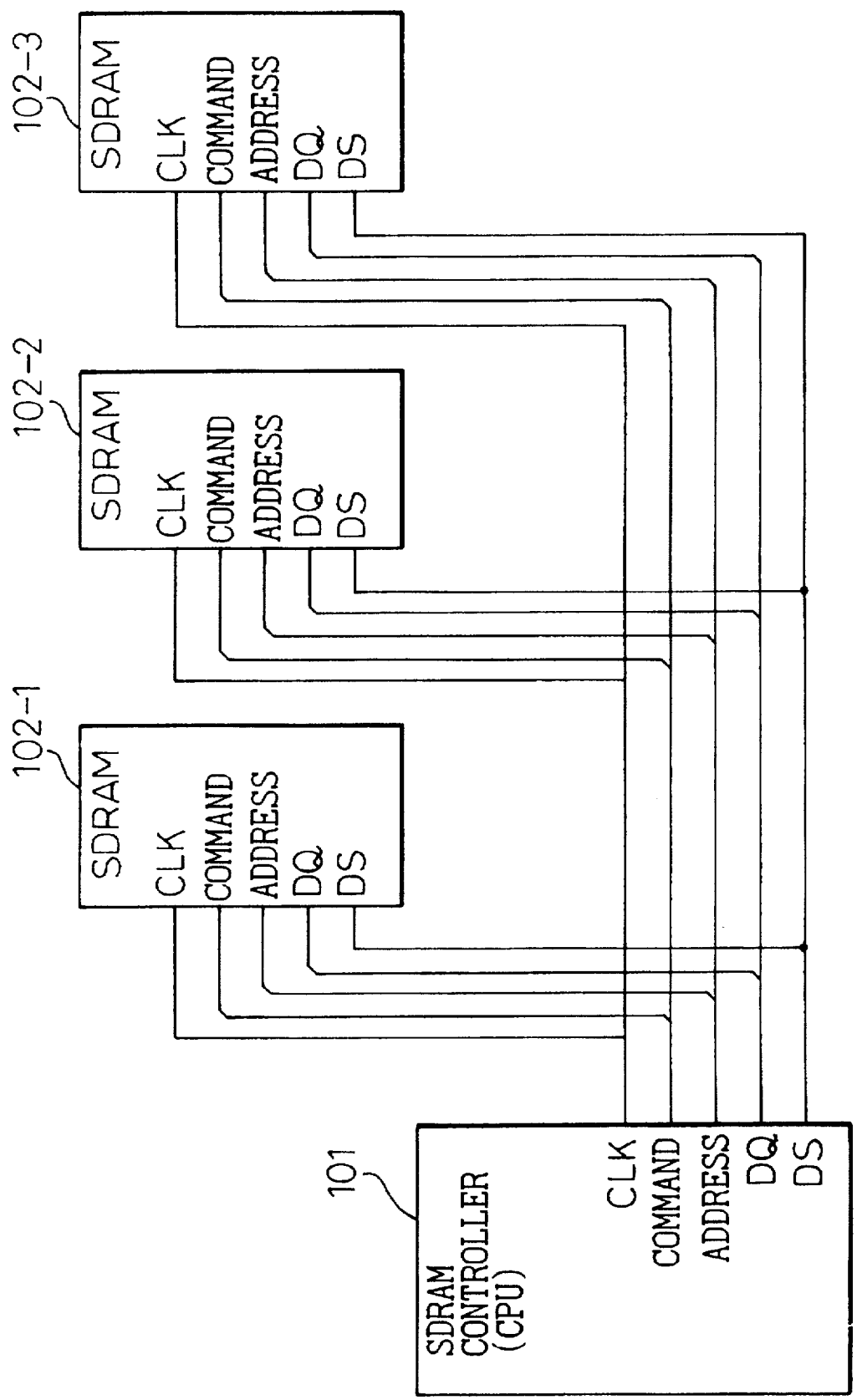
FIG. 1 is a diagram showing an example of a system configuration using a synchronous DRAM (SDRAM)

FIG. 1 is a diagram showing an example of a memory system configuration using a plurality of SDRAMs. As shown in FIG. 1, the plurality of SDRAMs 102-1, 102-2, 102-3, . . . are connected to an SDRAM controller 101 by a clock (CLK) signal line, a command bus, an address bus, a data (DQ) bus, and a data strobe (DS) signal line. The SDRAM controller 101 is, for example, a CPU or an SDRAM control chipset. The SDRAMs may be constructed as a module having a plurality of SDRAM chips mounted therein. Since SDRAM data bit width is usually 8 bits or so, if the data (DQ) bus is 64 bits wide, a module with four SDRAMs each with a 16-bit data width is used.

Figure 2:
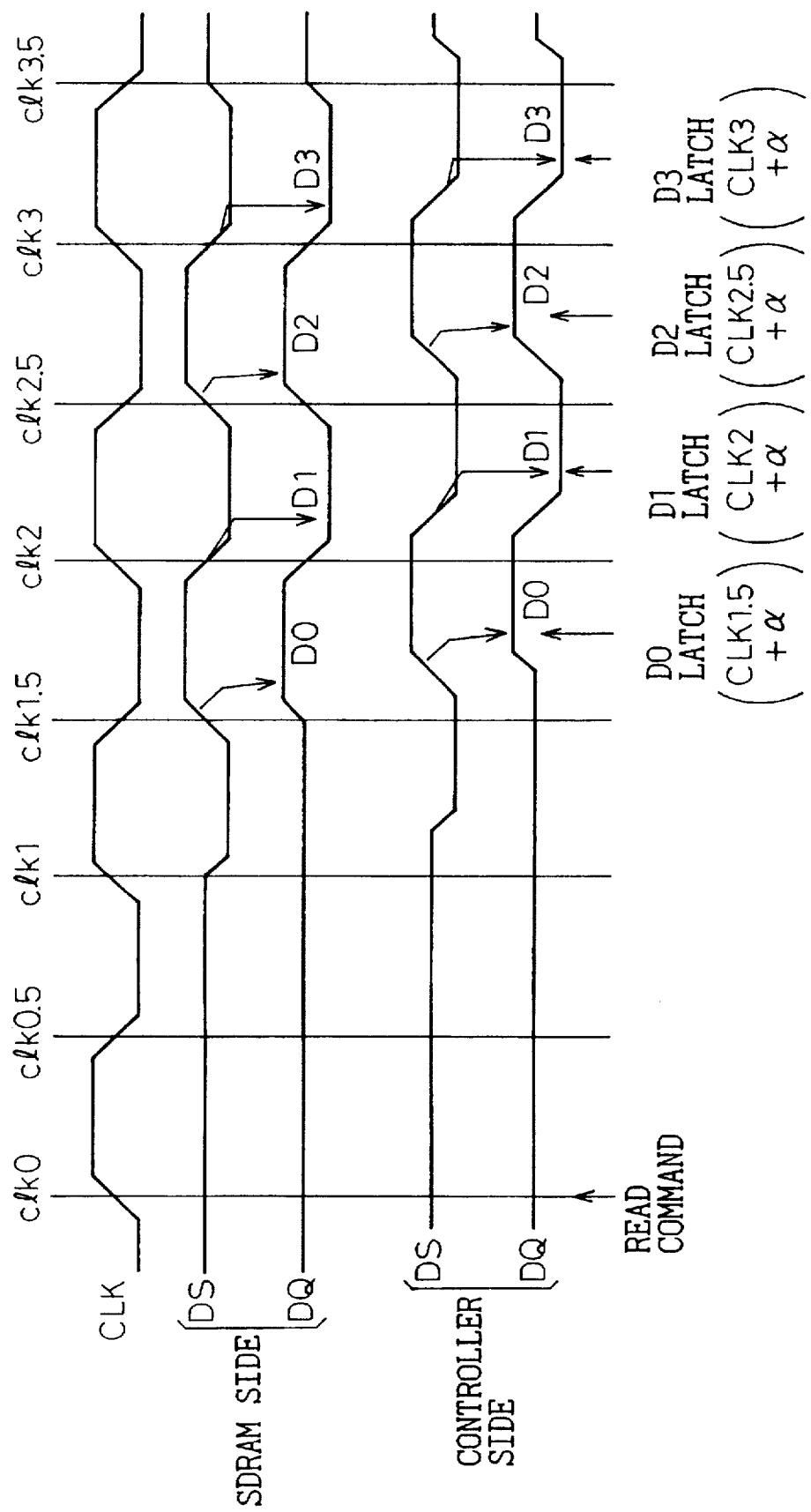
FIG. 2 is a diagram illustrating a data read operation from the SDRAM that outputs a data strobe signal.

FIG. 2 is a diagram illustrating a data read operation from SDRAM in the memory system using the SDRAMs shown in FIG. 1; each SDRAM outputs a data strobe signal DS. As shown in FIG. 2, on the SDRAM side, DS changes from a high impedance state to a low impedance state (L) after a prescribed number of clock cycles from the input of a read command. In this example, DS changes to L after 1.5 clock cycles. Then, data DQ is output synchronously with both the subsequent L to high (H) transition and H to L transition of DS. At the controller side, the latching of DS is initiated when a prescribed time has elapsed after the output of the read command (in this example, the latching is initiated between 1.5 and 2.0 clocks), and the data DQ is latched synchronously with the rising and falling edges of DS. If DS and DQ are made perfectly identical in wiring length, layout, etc., the skew between DS and DQ can be reduced to almost zero. In this way, in the memory system of FIG. 1, by latching data DQ at the controller side by reference to DS regardless of which SDRAM the data is to be read from, optimum strobe points can always be set for readout data.

Figure 3:
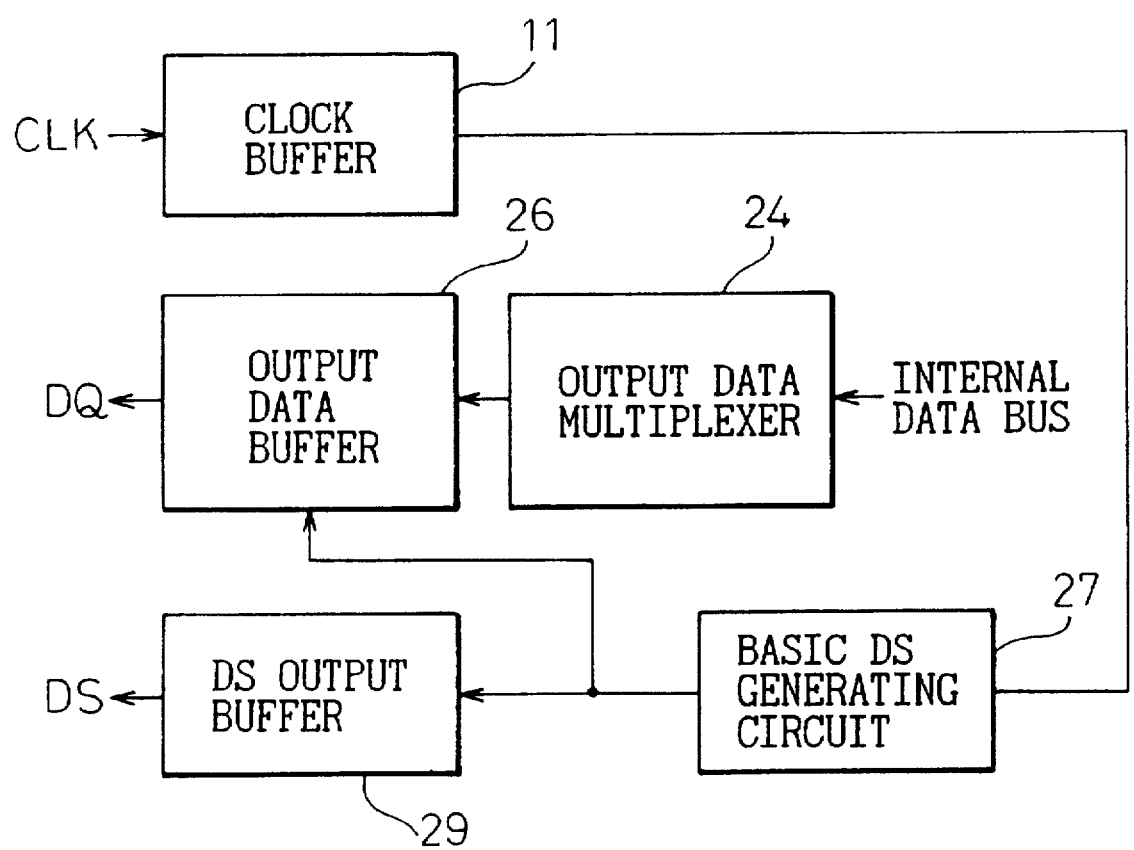
FIG. 3 is a diagram showing the configuration of a data output section of the SDRAM of FIG. 1.

FIG. 3 is a diagram showing an example of the configuration of a data output section of an SDRAM that outputs the data strobe signal DS. As shown in FIG. 3, the data output section includes a clock buffer 11 for latching an externally input clock CLK and generating an internal clock, an output data multiplexer 24 for converting the bit width of the data read from a memory cell, an output data buffer 26 for outputting a signal received from the output data multiplexer, a basic DS generating circuit 27 for generating a basic DS signal based on which the data strobe signal DS is generated from the internal clock, and a DS output buffer 29 for outputting the data strobe signal DS based on the basic DS signal. The output buffer 26 also outputs data based on the basic DS signal.

Figure 4:
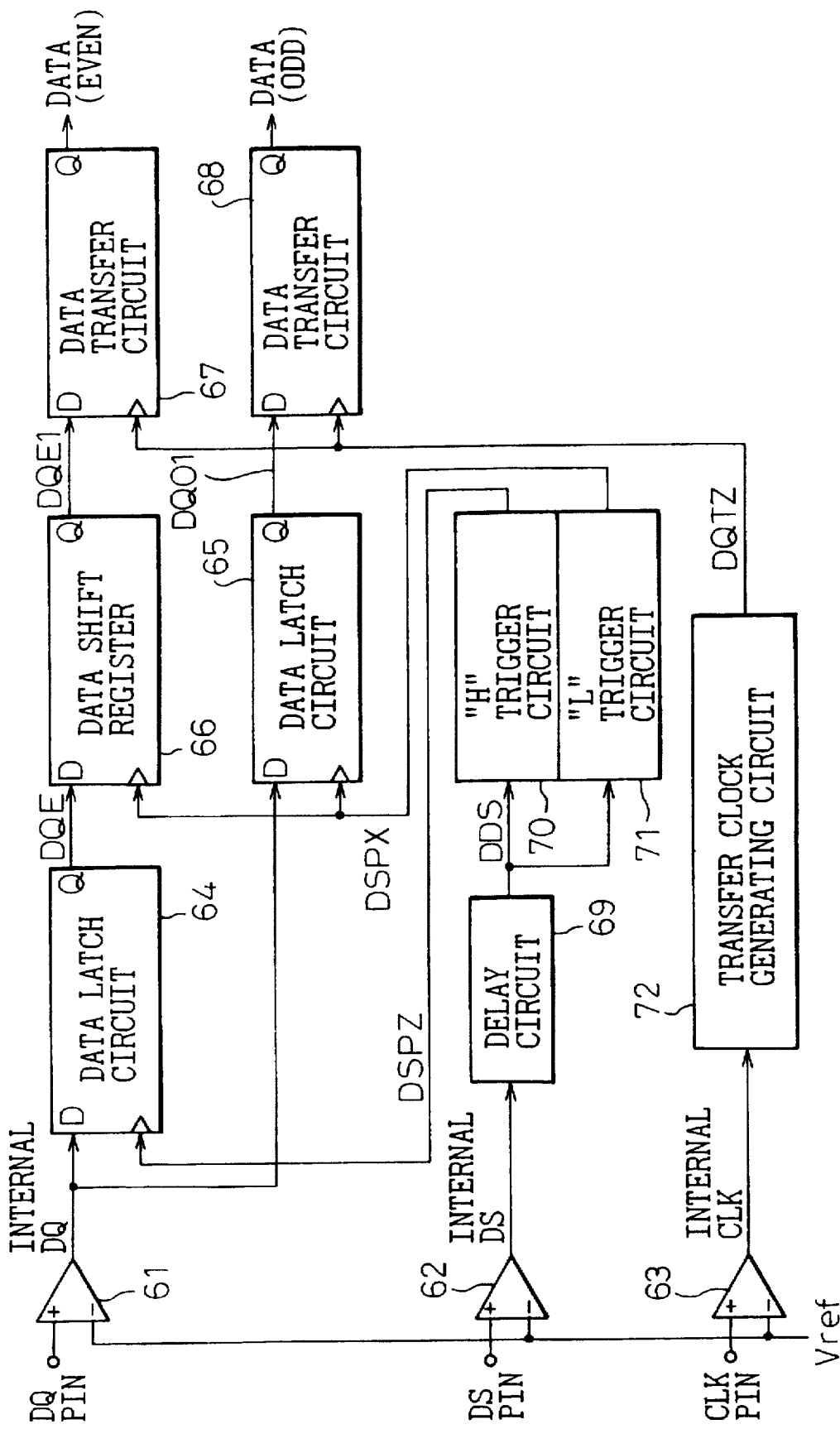
FIG. 4 is a diagram showing an example of a data latch circuit in a controller.

FIG. 4 is a diagram showing an example of the configuration of a readout data latch circuit in the controller 101 shown in FIG. 1. As shown in FIG. 4, the data DQ, data strobe signal DS, and clock CLK are input to input buffers 61, 62, and 63, respectively. The clock shown here is the clock input from an element at a higher-level than the controller 101 and is different from the CLK shown in FIG. 1. An internal clock is generated from the clock shown in FIG. 4, and from that internal clock, the clock shown in FIG. 1 is generated for output. In the example shown in FIG. 4, one data set is formed by two data elements successively read out from the SDRAM, and the two data elements are output as a pair. Data latch circuits 64 and 65, a data shift circuit 66, and data transfer circuits 67 and 68 are provided for that purpose. The DS applied to the input buffer 62 is delayed through a delay circuit 69, and the resulting delayed signal DDS is input to an "H" edge trigger circuit 70 and an "L" edge trigger circuit 71 which generate latch pulses DSPZ and DSPX respectively in synchronism with an "H" edge and "L" edge of DS. The latch pulse DSPZ from the "H" edge trigger circuit 70 is input to the data latch circuit 64, and the data latch circuit 64 latches the data DQ with a prescribed time delay from the "H" edge of DS. Likewise, the latch pulse DSPX from the "L" edge trigger circuit 71 is input to the data latch circuit 65, and the data latch circuit 65 latches the data DQ with the prescribed time delay from the "L" edge of DS. The latch pulse DSPX from the "L" edge trigger circuit 71 is also input to the data shift circuit 66, which latches the output of the data latch circuit 64 with the prescribed time delay from the "L" edge of DS. In this way, the two data elements are synchronized together. Data transfer circuits 67 and 68 transfer the respective data elements synchronously with a transfer clock DQTZ.

As shown in FIG. 2, DQ changes at the transition edges of DS; if the latched DS is directly input to the "H" edge trigger circuit 70 and "L" edge trigger circuit 71 to generate the latch pulses, the DQ is still not stable and accurate latching cannot be done. To avoid this, the delay circuit 69 is used to delay the DS so that the data can be latched by the data latch circuits 64 and 65 at optimum timings.

Figure 5:
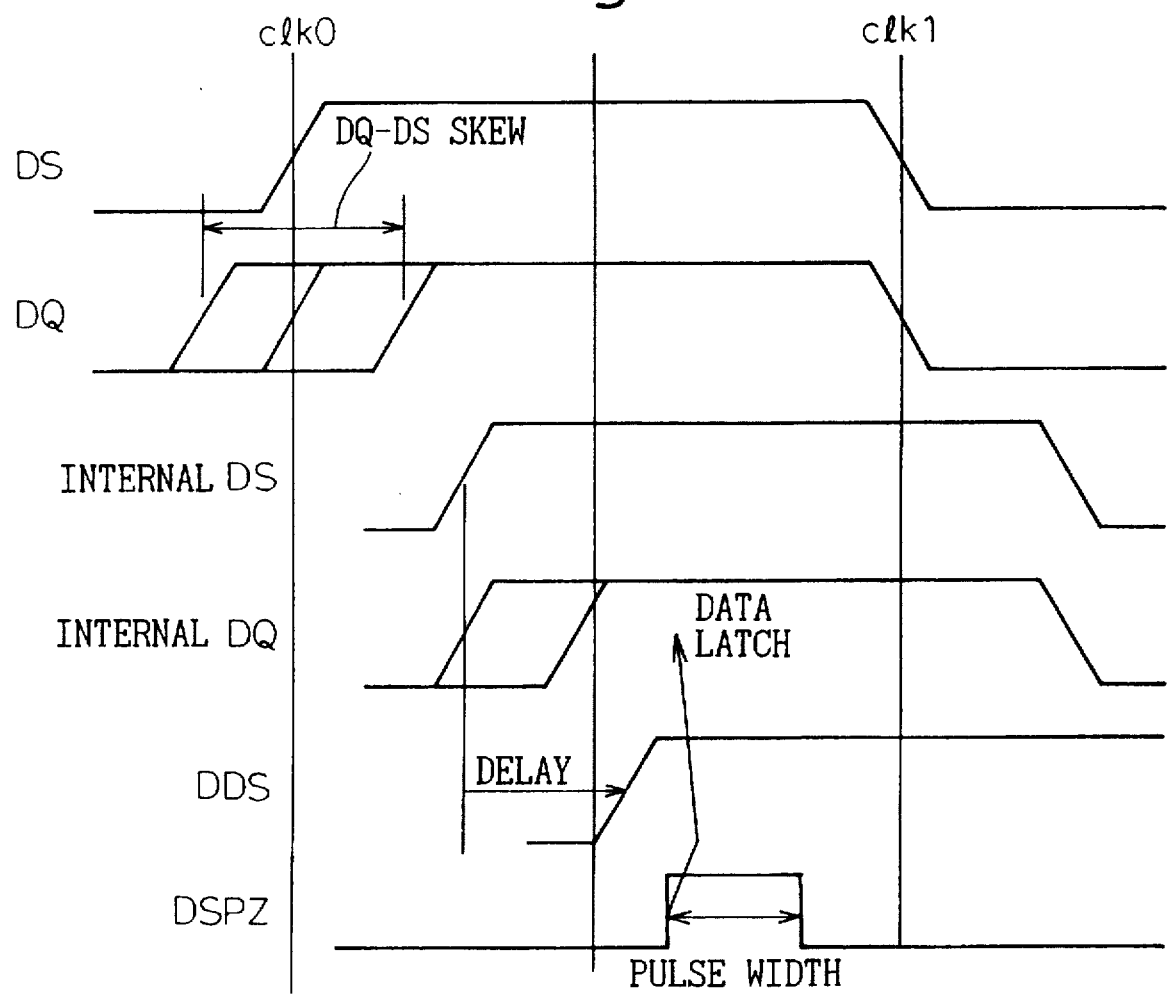
FIG. 5 is a diagram illustrating a data latch operation in the controller according to FIG. 4.

FIG. 5 is a diagram for explaining the margin allowed for the data latch operation in the example of the readout data latch circuit shown in FIG. 4. As previously described, though the circuit arrangement is done so as to reduce the skew between DS and DQ to almost zero, the skew cannot be eliminated completely since there will actually exist slight differences in wiring and also differences between wiring patterns for the multi-bit data DQ. For example, it is assumed here that there occurs a skew of ±0.5 ns, or a total of 1.0 ns. Furthermore, the pulses used to latch the data by the data latch circuits 64 and 65 must be provided with a minimum required width, which is assumed here to be 1.5 ns. It is also assumed that a difference of 0.5 ns occurs due to differences in the layout of the plurality of multi-bit data lines DQ within the controller, in wiring length, and even in leadframe length. Further, the circuit of FIG. 4 uses the delay circuit 69, but manufacturing variations among chips and variations in temperature and supply voltage also cause some degree of variation. This variation is assumed to be about 1.0 ns. Overall, a margin of about 4.0 ns has to be allowed. This determines the limit of the operating speed of the SDRAM; that is, allowing the margin of 4.0 ns means the maximum operating speed of 250 MHz. Therefore, to achieve a higher-speed SDRAM, this operating margin must be reduced.

Figure 6:
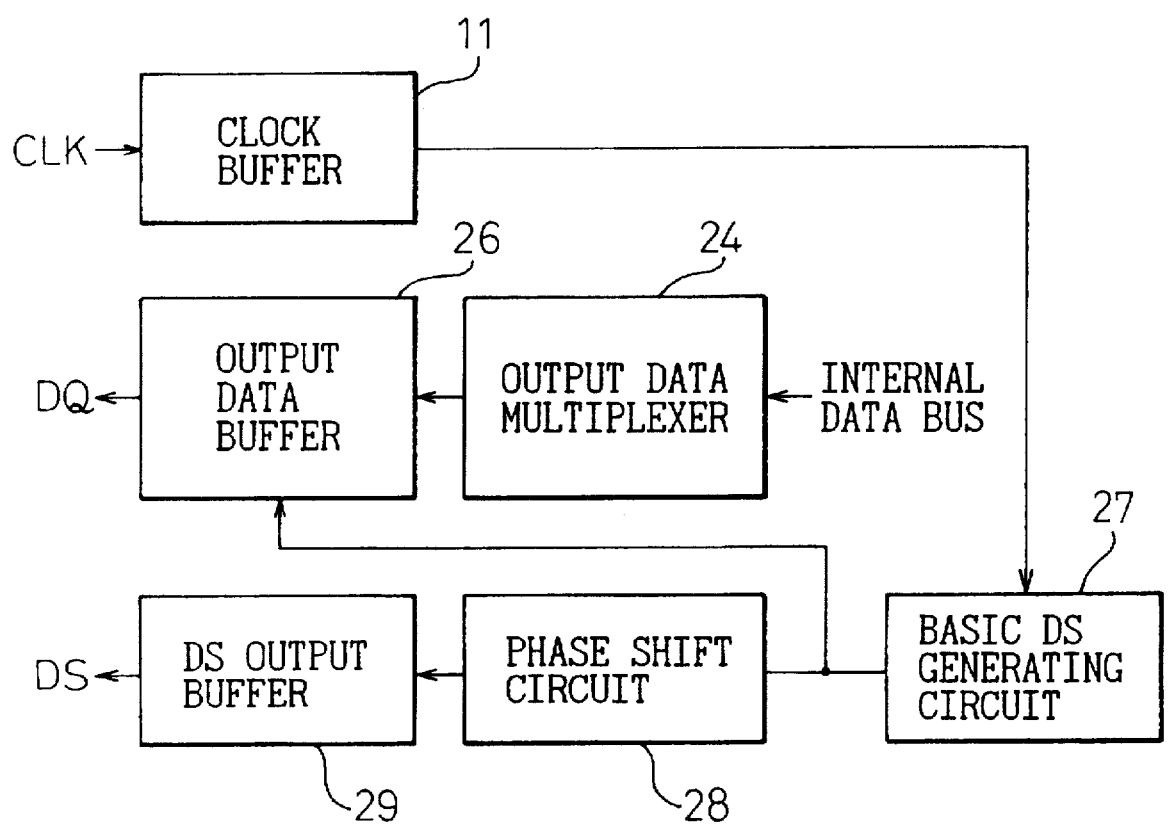
FIG. 6 is a diagram showing the basic configuration of an SDRAM according to the present invention.
Figure 7:
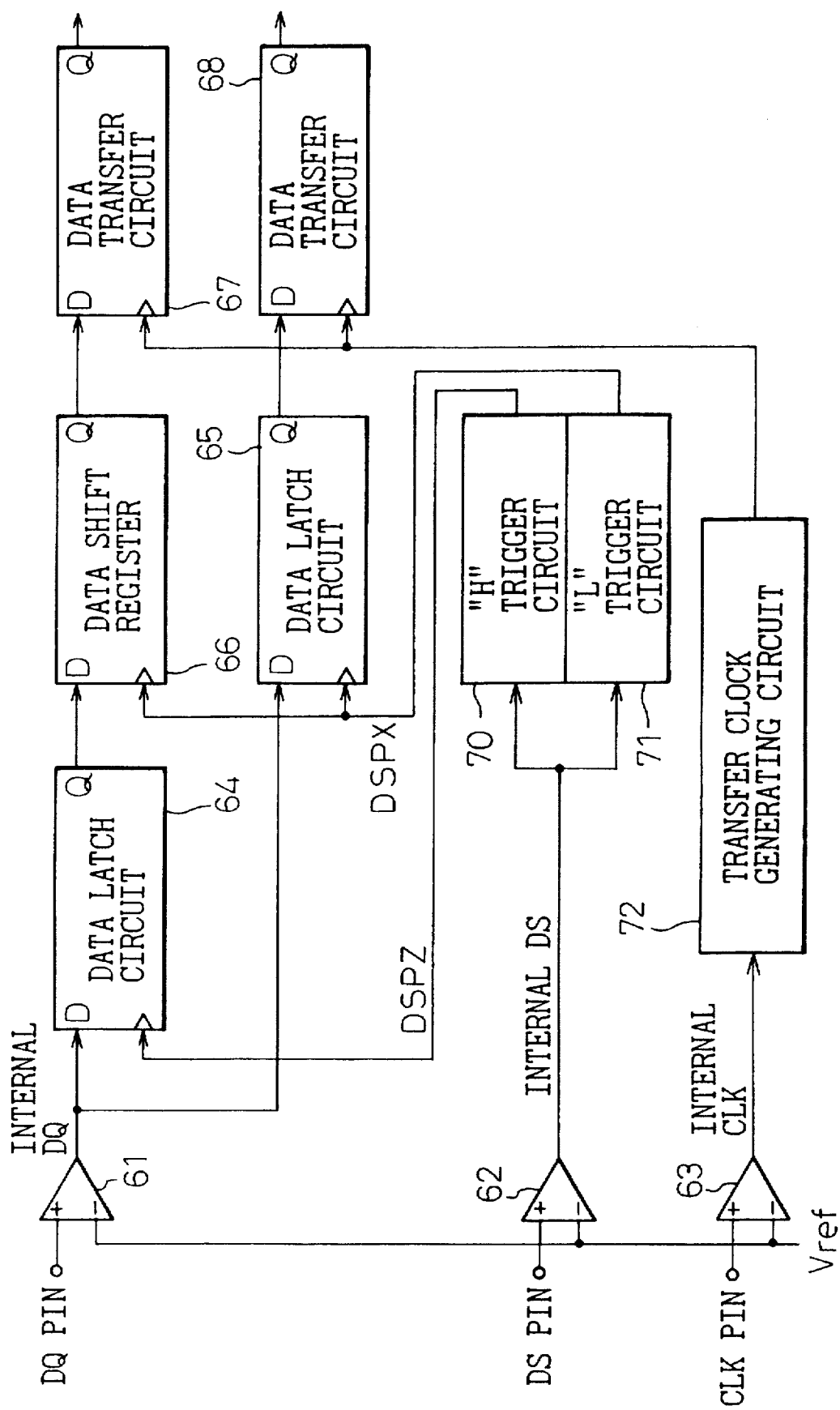
FIG. 7 is a diagram showing the configuration of a data latch circuit at the controller side when the present invention is applied.
Figure 8:
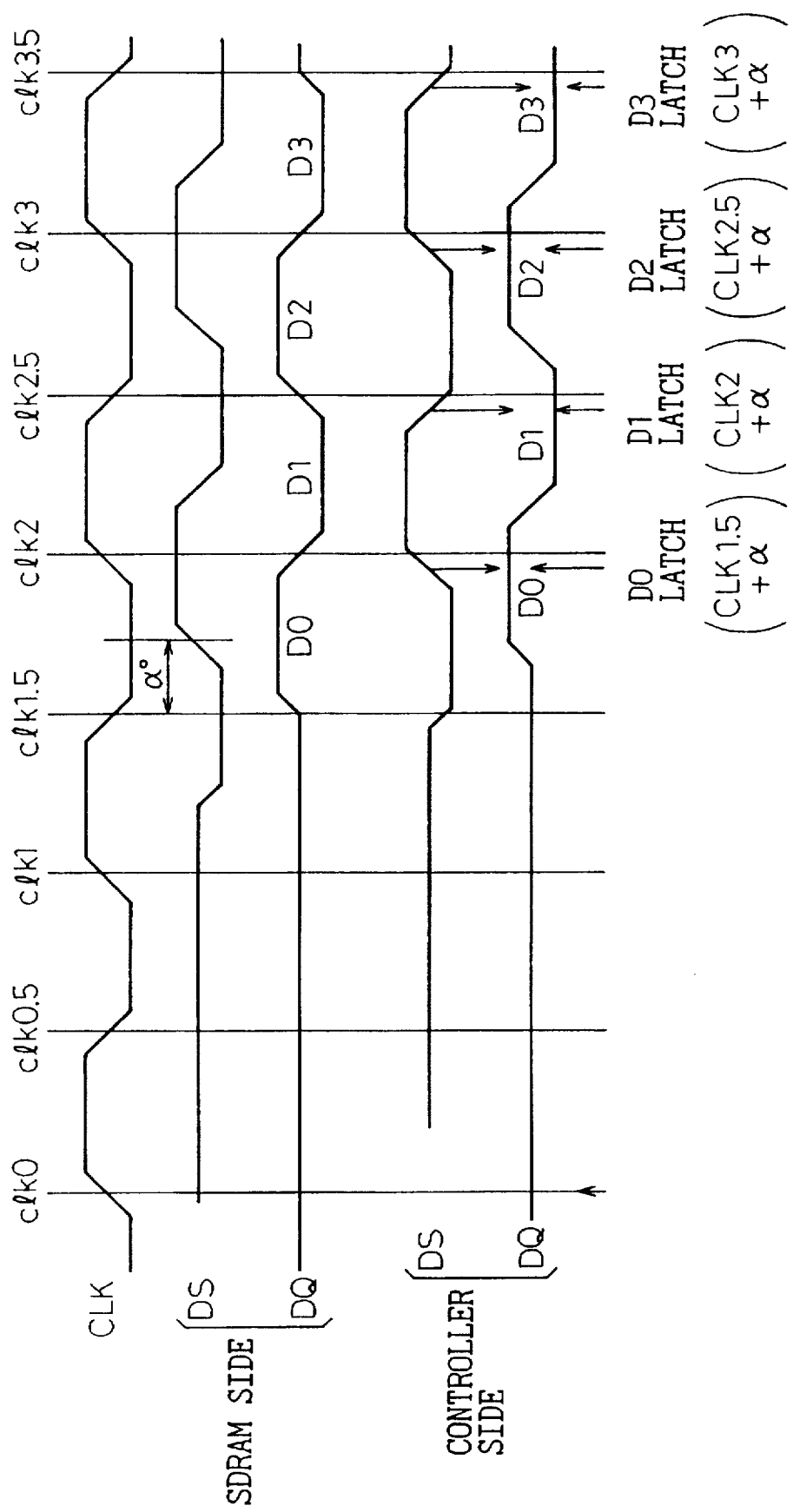
FIG. 8 is a diagram for explaining the principle of the present invention.

FIG. 6 is a diagram showing the basic configuration of a semiconductor memory device to which the present invention is applied. FIG. 7 is a diagram showing the basic configuration of a data latch circuit at the controller side when the present invention is applied. FIG. 8 is a diagram for explaining the principle of the present invention, and FIG. 9 is a diagram for explaining a margin for a data latch operation according to the present invention.

As shown in FIG. 6, in the semiconductor memory system and semiconductor memory device of the present invention, an output phase shift circuit 28 is provided that introduces a prescribed phase angle between output data DQ and data strobe signal DS, and this phase difference is maintained constant throughout the operation. More specifically, the phase relationship is controlled so that the strobe signal DS changes with a delay of phase angle α from a transition edge of the output data DQ, as shown in FIG. 8. This angle α is determined so that optimum latch timings can be achieved when latch pulses are generated by inputting the DS received at the controller directly into the "H" and "L" edge trigger circuits 70 and 71 shown in FIG. 7. Accordingly, when the present invention is applied, the delay circuit used in the prior art example need not be provided in the data latch circuit at the controller side, as shown in FIG. 7.

Figure 9:
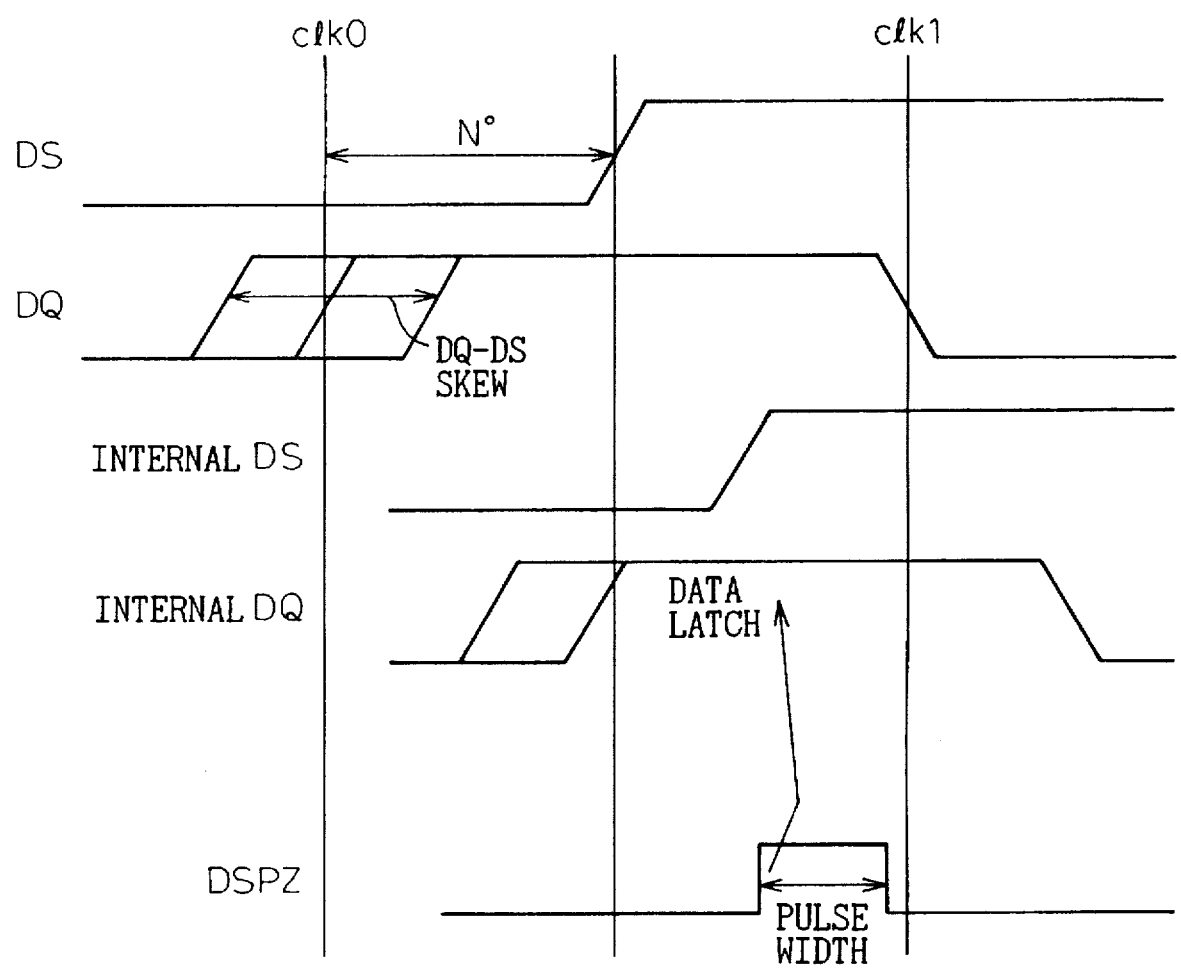
FIG. 9 is a diagram for explaining a margin for a data latch operation according to the present invention.

As shown in FIG. 9, the internal DS generated from the latched DS is not delayed but immediately used to generate the latch pulse DSPZ. This means the elimination of the margin of about 1.0 ns provided in the prior art example by considering manufacturing variations among delay circuit chips and differences in temperature and supply voltage. Since other margins are the same, by applying the present invention the operating margin can be reduced to 3.0 ns from the 4.0 ns of the prior art example, which means that the operating speed can be increased to 330 MHz.

As already described, it is desirable that the data strobe signal DS have a 50% duty cycle, and the data output is performed twice during one cycle of the data strobe signal DS. In this case, it is desirable that the phase angle of the data strobe signal DS with respect to the output data be set at 90 and 270 degrees, respectively.

It is also desirable that the output phase shift circuit be configured to be capable of adjusting the phase difference between the output data and data strobe signal to a plurality of set values so that the circuit can be used with various types of controller, and that the values can be set from the controller. In that case, a mode register must be provided to store a plurality of control values corresponding to the plurality of phase difference values defining the phase difference between the output data and the data strobe signal, and to select and output one of the control values in response to a command signal from the controller, and the output phase shift circuit must be able to adjust the phase difference based on the control value output from the mode register.

Figure 10:
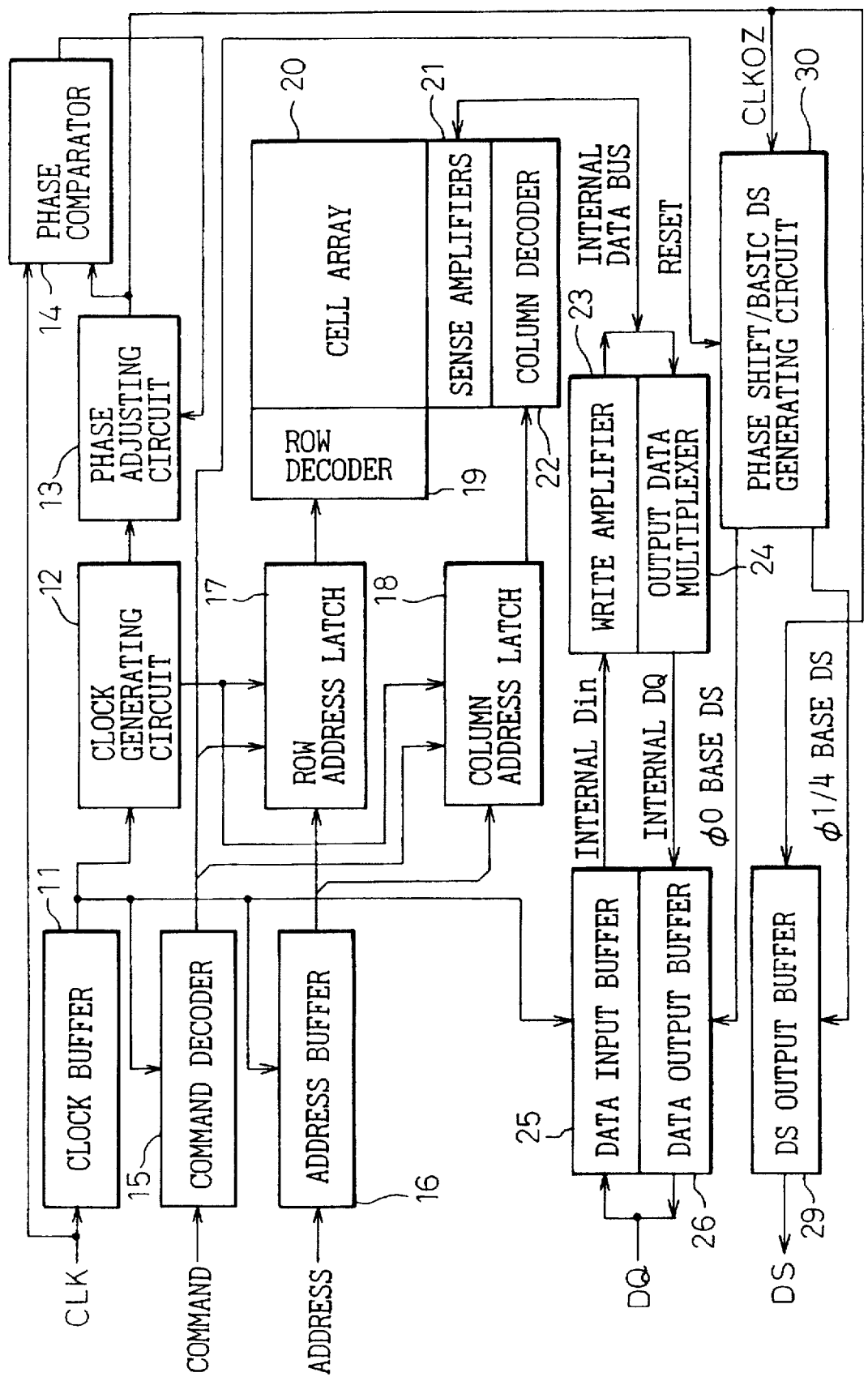
FIG. 10 is a diagram showing the general configuration of an SDRAM according to a first embodiment of the present invention.

FIG. 10 is a diagram showing the general configuration of a synchronous DRAM (SDRAM) according to a first embodiment of the present invention. As shown in FIG. 10, the SDRAM comprises: a clock buffer 11 for receiving an externally input clock CLK; a clock generating circuit 12 for generating an internal clock from the output of the clock buffer 11; a phase adjusting circuit 13 for generating from the internal clock a synchronous internal clock CLKOZ synchronized to the CLK; a phase comparator circuit 14 for comparing the phases of CLKOZ and CLK and for generating a control signal for the phase adjusting circuit 13; a command register 15 for receiving a command signal; an address buffer 16 for receiving an address signal; a row address latch 17 for latching a row address carried in the address signal; a column address latch 18 for latching a column address carried in the address signal; a row decoder 19 for decoding the row address output from the row address latch 17; a cell array 20; sense amplifiers 21 for amplifying input/output signals of the cell array 20; a column decoder 22 for decoding the column address output from the column address latch 18; a write amplifier 23; an output data multiplexer 24; a data input buffer 25; a data output buffer 26; an output buffer 29 for a data strobe signal DS; and a phase shift/basic DS generating circuit 30 for generating a basic DS signal used to generate the data strobe signal DS. This embodiment differs from the configuration of the prior art example only by the inclusion of the phase shift/basic DS generating circuit 30, phase adjusting circuit 13, and phase comparator circuit 14; the other portions are the same as the prior art and descriptions of such parts will be omitted here, the following description thus dealing only with the different portions. Here, the internal data bus connecting the sense amplifiers 21 with the write amplifier 23 and output data multiplexer 24 may have the same data width as that of an external data bus or may have a data width, for example, two or four times that of the external data bus.

Figure 11:
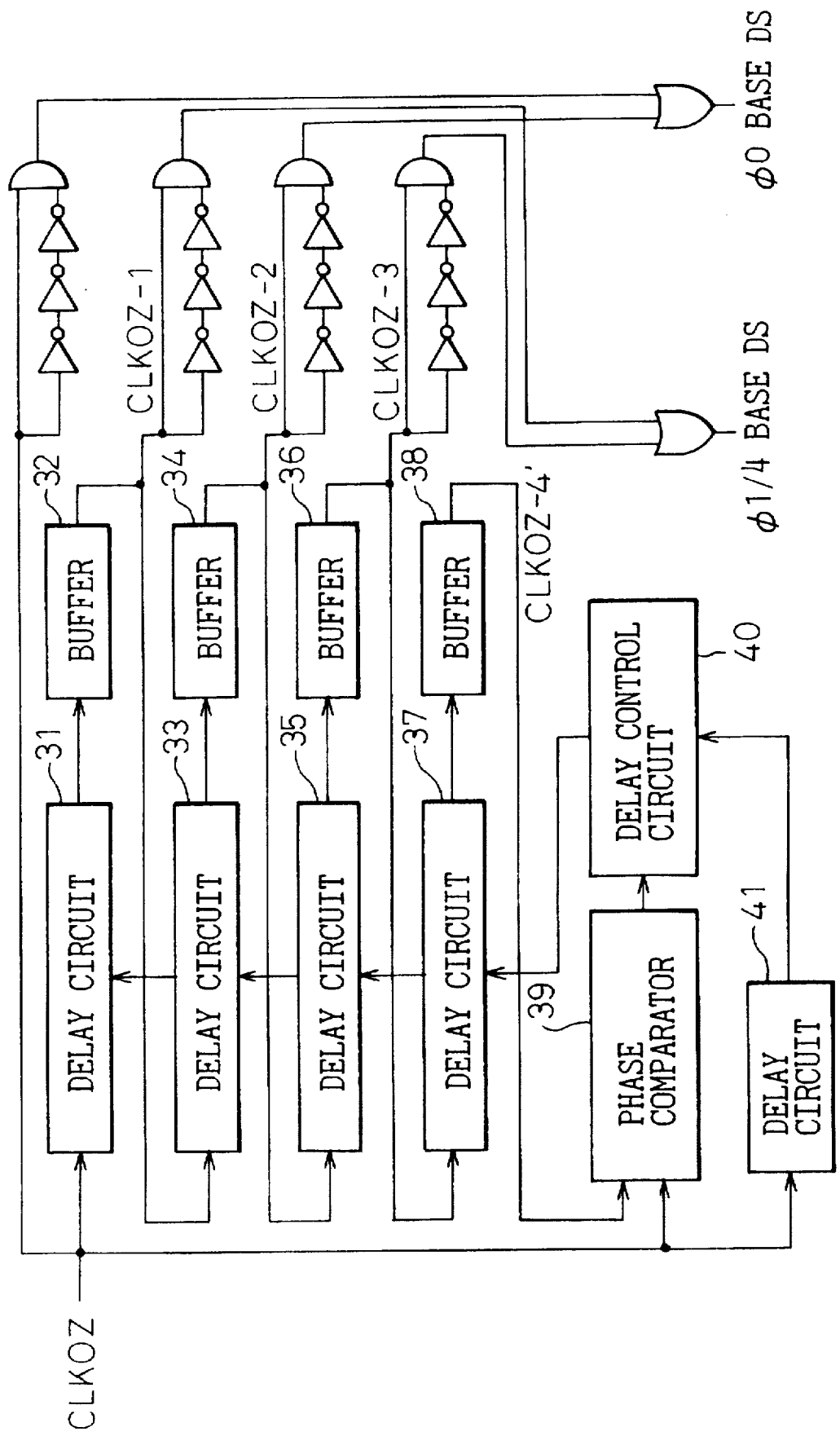
FIG. 11 is a diagram showing the configuration of a phase shift basic DS generating circuit according to the first embodiment.

FIG. 11 is a diagram showing the configuration of the phase shift/basic DS generating circuit 30. As shown in FIG. 11, the phase shift/basic DS generating circuit 30 includes four delay circuit/buffer circuit pairs, 31/32, 33/34, 35/36, and 37/38, connected in series. Each delay circuit as well as each buffer circuit has an equivalent configuration, and the delay amount in each of the delay circuits 31, 33, 35, and 37 is controlled jointly by a delay control circuit 40. Therefore, each delay circuit has the same delay amount. The synchronous internal clock CLKOZ is input to the first delay circuit 31. A phase comparator circuit 39 compares the phase of CLKOZ with the phase of the output of the final-stage buffer circuit 38, and supplies the result of the comparison to the delay control circuit 40. Based on the result of the comparison, the delay control circuit 40 jointly controls the delay amount in each of the delay circuits 31, 33, 35, and 37 so that the output of the final-stage buffer circuit 38 is brought in phase with the CLKOZ. Therefore, when the output of the final-stage buffer circuit 38 is in phase with the CLKOZ, it follows that the signals input to the delay circuits 31, 33, 35, and 37 are respectively shifted in phase by a quarter cycle, or 90°. Three inverters in series and an AND gate form a circuit that generates a pulse narrower than the clock at the rising edge (H edge) of the signal input to its associated delay circuit 31, 33, 35, or 37. The narrow pulses generated from the input signals to the delay circuits 31 and 35 are summed by an OR gate to produce φ0 basic DS, while the narrow pulses generated from the input signals to the delay circuits 33 and 37 are summed by an OR gate to produce φ¼ basic DS. As is apparent from the above explanation, the φ¼ basic DS is delayed 90° in phase with respect to the φ0 basic DS. The φ¼ basic DS is output as a latch pulse for the DS output buffer 29 and the φ0 basic DS as a latch pulse for the data output buffer 26.

Figure 12:
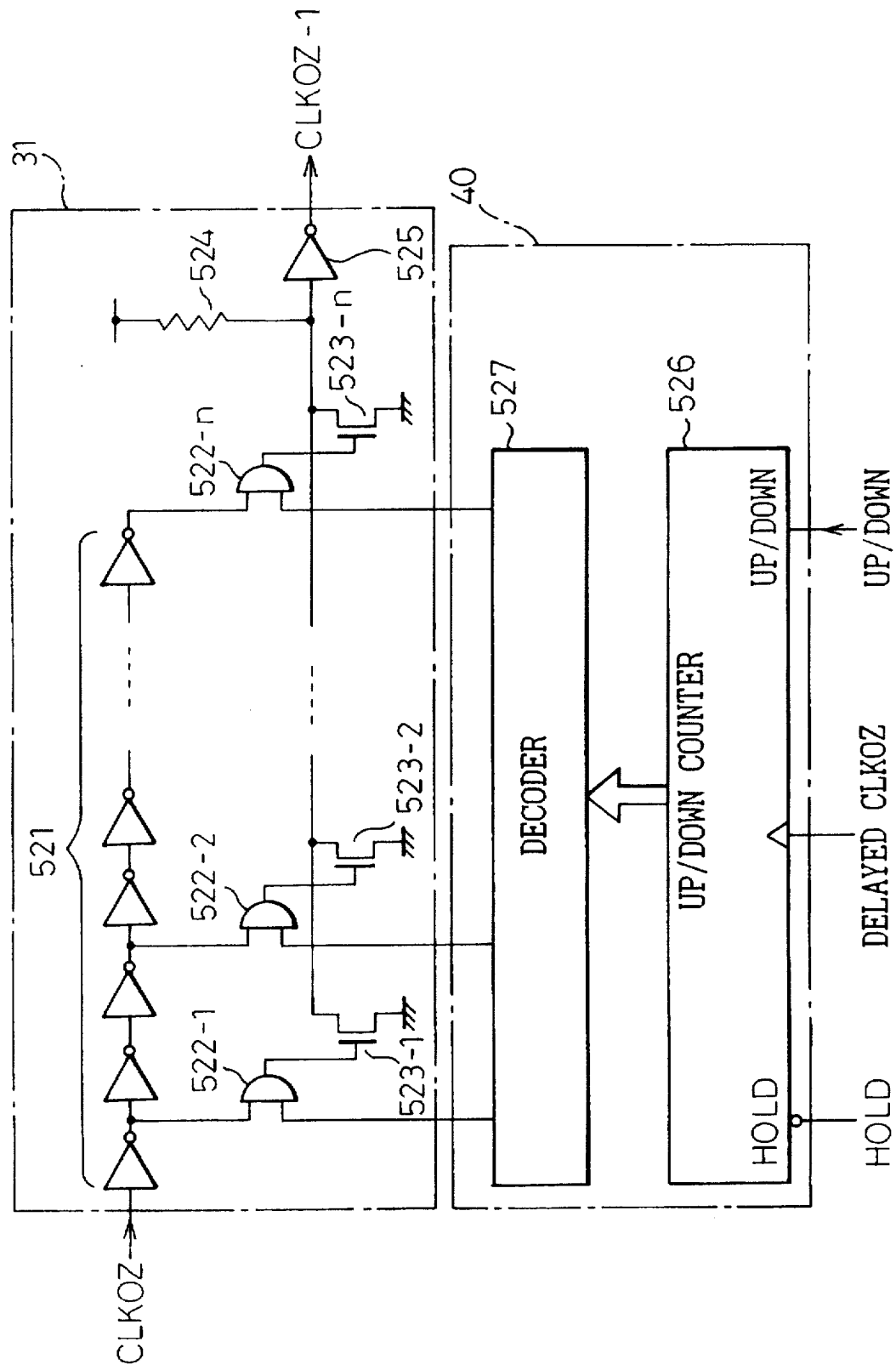
FIG. 12 is a diagram showing the configuration of a delay circuit and delay control circuit.

FIG. 12 is a diagram showing the configuration of the delay circuit 31 and delay control circuit 40. The delay circuits 33, 35, and 37 have the same configuration as the delay circuit 31 and are controlled jointly by a signal from the delay control circuit 40, but they are not shown here. Further, FIG. 13 is a diagram showing the configuration of the phase comparator circuit 39, and FIG. 14 is a diagram for explaining the operation of the phase comparator circuit 39.

As shown in FIG. 12, the delay circuit 31 comprises: an inverter array 521 consisting of a plurality of inverters connected in series; an AND gate array consisting of a plurality of AND gates 522-1, 522-2, . . . , 522-n arranged so that one input of each AND gate is coupled to the output of every other inverter in the inverter array 521; a transistor array consisting of N-channel transistors 523-1, 523-2, . . . , 523-n whose gates are supplied with the outputs of the corresponding AND gates, whose bases are grounded, and whose drains are connected in common; a resistor 524 connected between a signal line, to which the drains of the N-channel transistors are connected in common, and a high level voltage supply line; and a buffer 525 whose input is connected to that signal line and which outputs an internal clock CLK2. The delay control circuit 40 comprises an up/down counter 526 and a decoder 527. The up/down counter 526 does not count when hold signal HOLD is "L"; when the hold signal HOLD is "H", the up/down counter 526 performs counting in synchronism with the rising of a delayed CLKOZ signal output from a delay circuit 41, in the up direction when up/down signal is "H" and in the down direction when it is "L". The decoder 527 decodes the output of the up/down counter 526 and sets one of its outputs "H" and the other outputs "L". When the up/down counter 526 counts up, the position of the output to be set "H" is shifted to the right, and when counting down, that output position is shifted to the left. The outputs of the decoder 527 are coupled to the other inputs of the AND gates 522-1, 522-2, . . . , 522-n, and only the AND gate receiving the "H" output from the decoder 527 is activated. Of the outputs of the inverter array, the signal being applied to the activated AND gate is output as the internal clock CLK2. In this way, since the number of stages for the signal to propagate through the inverter array changes depending on which AND gate is activated, the delay amount for the internal clock can be selected appropriately. Here, the delay amount can be controlled with an accuracy equivalent to the delay amount of two inverters.

Figure 13:
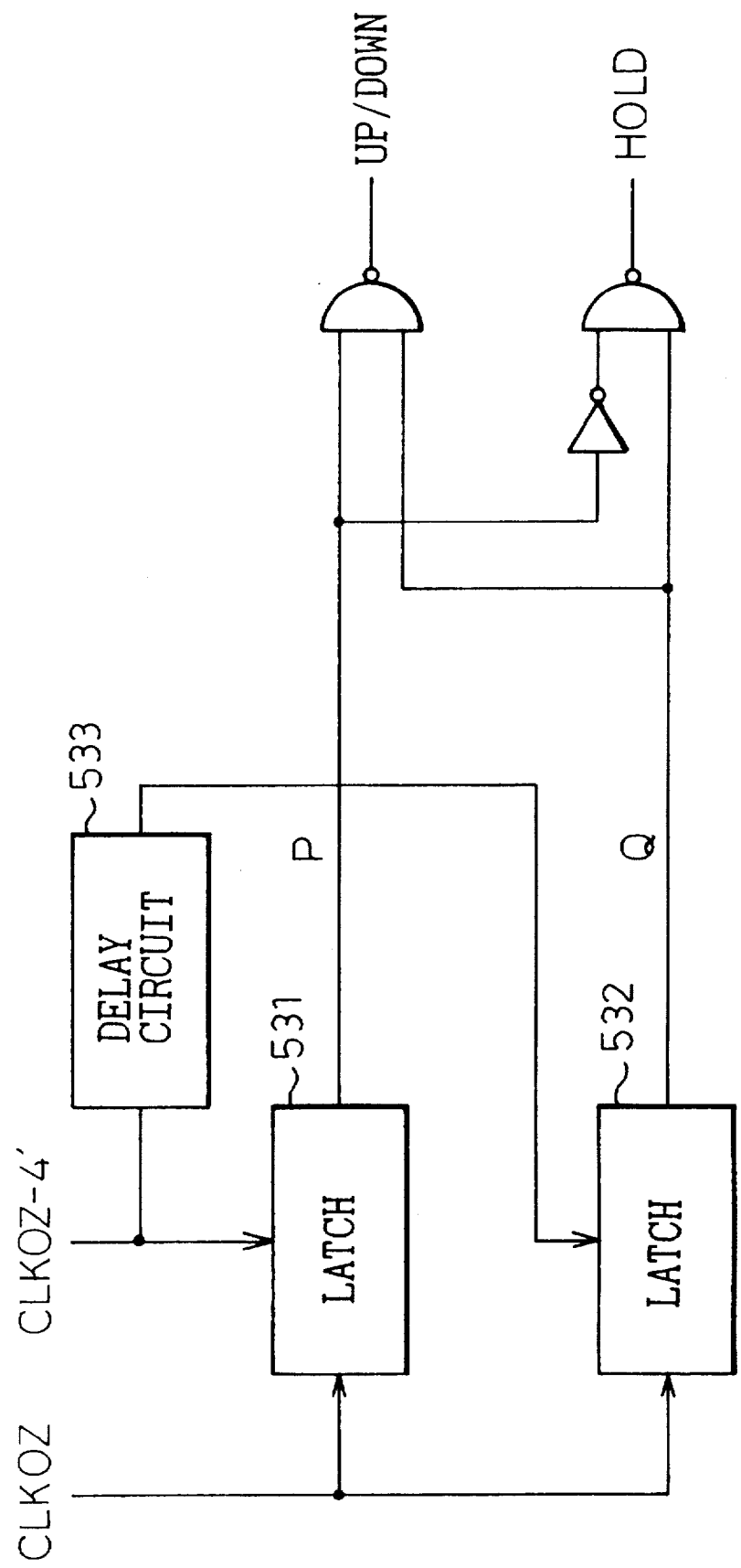
FIG. 13 is a diagram showing the configuration of a phase comparator circuit.
Figures 14A, 14B:
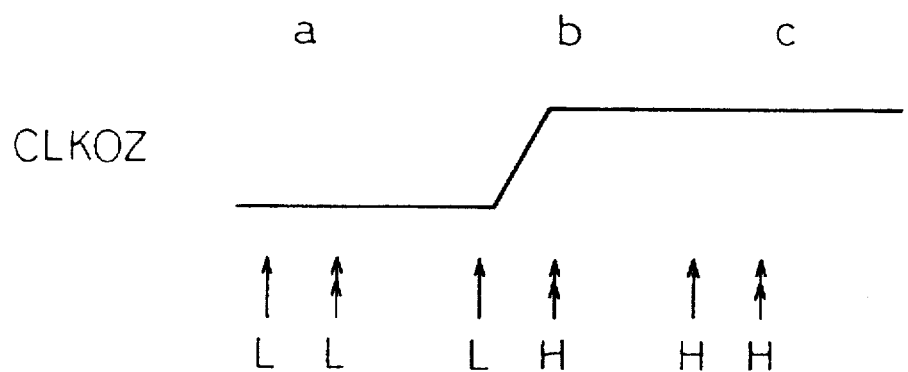
FIGS. 14A and 14B are diagrams for explaining the operation of the phase comparator circuit of the first embodiment.

As shown in FIG. 13, the phase comparator circuit 39 comprises: a latch circuit 531 which latches the synchronous internal clock CLKOZ in synchronism with CLKOZ-4' output from the buffer 38; a latch circuit 532 which latches the synchronous internal clock CLKOZ in synchronism with a signal produced by delaying CLKOZ-4' through a delay circuit 533 by an amount equivalent to one delay stage in the delay circuit 31; and an AND gate, a NAND gate, and an inverter for performing operations on the outputs P and Q of the respective latch circuits. As shown in FIG. 14A, the timing for latching the CLKOZ is displaced between the latch circuits 531 and 532, which thus latch the CLKOZ at different points. In state a where the CLKOZ-4' leads in phase, the outputs P and Q of the latch circuits 531 and 532 are both "L", and in state c where the CLKOZ-4' lags in phase, P and Q are both "H", while when the CLKOZ and CLKOZ-4' are almost in phase, P is "L" and Q is "H". The truth table for this is shown in FIG. 14B. In the circuit of FIG. 13, when P and Q are both "L", HOLD is "H" and the up/down signal is "H" so that the delay amount in each of the delay circuits 31, 33, 35, and 37 is increased, and when P and Q are both "H", HOLD is "H" and the up/down signal is "L" so that the delay amount in each of the delay circuits 31, 33, 35, and 37 is decreased. On the other hand, when P is "L" and Q is "H", HOLD is "L", so that no change occurs in the delay amount in each of the delay circuits 31, 33, 35, and 37.

Figure 15:
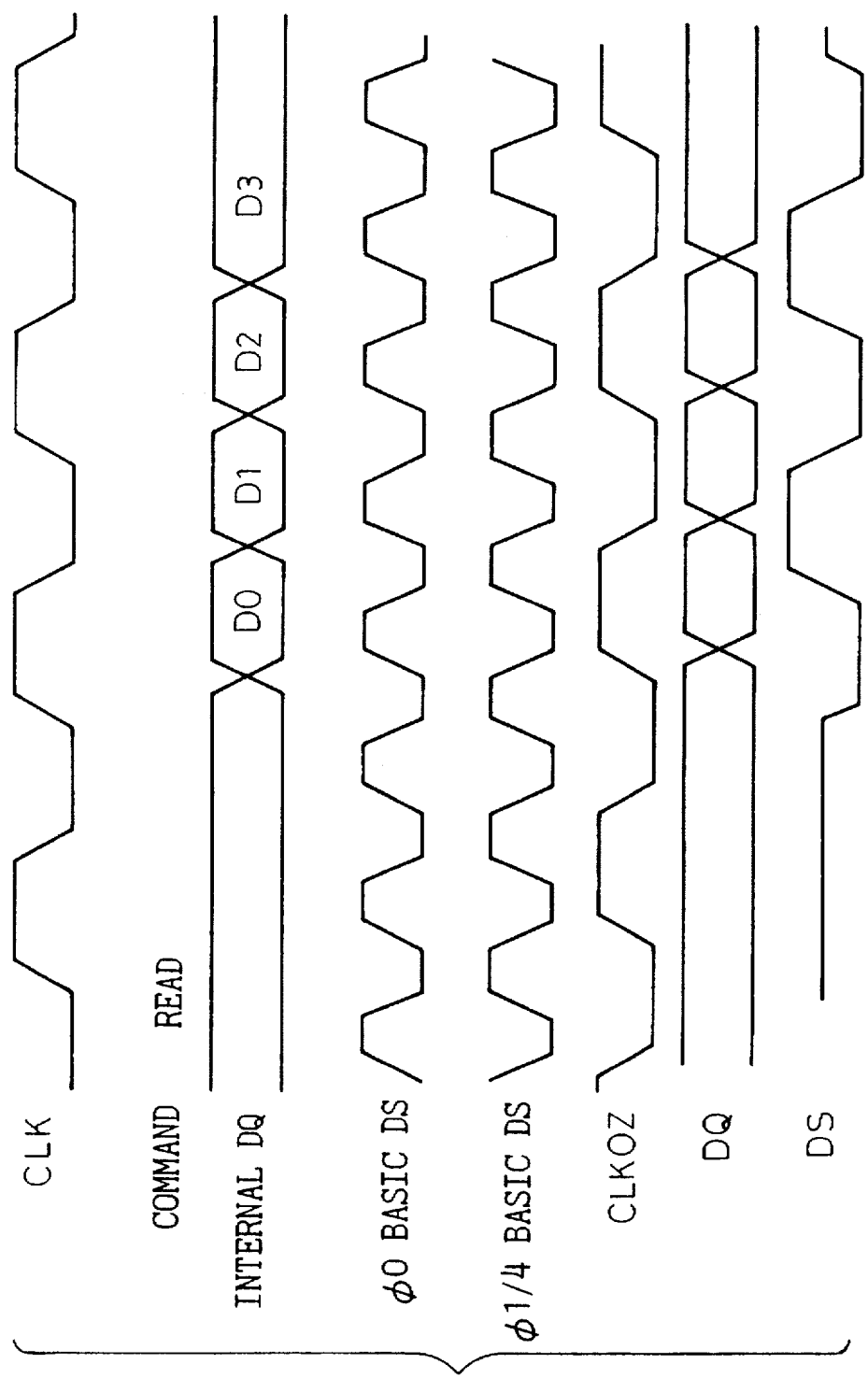
FIG. 15 is a diagram illustrating an output operation of the SDRAM of the first embodiment.

FIG. 15 is a diagram illustrating an output operation of the SDRAM according to the first embodiment. With the circuits shown in FIGS. 11 to 13, the φ0 basic DS and φ¼ basic DS are generated as shown in FIG. 15. It is assumed here that the phase shift basic DS generating circuit is constantly generating the φ0 basic DS and φ¼ basic DS regardless of whether the DS is output or not, and that control as to whether outputs should be produced in response to a read operation, etc. is performed by controlling the data output buffer 26 and DS output buffer 29 using a not shown control circuit. As shown in FIG. 15, the data output buffer 26 latches the internal DQ by using the φ0 basic DS and outputs the DQ as shown. Likewise, the DS output buffer 29 latches the CLKOZ by using the φ¼ basic DS and outputs the DS as shown.

In this way, from the SDRAM of the first embodiment, data is output twice during one clock CLK cycle, and the data strobe signal DS is output and changes at a timing delayed precisely by 90° of the clock cycle from the data output timing. As a result, the controller can generate a latch signal for the input data directly from the received DS.

Figure 16:
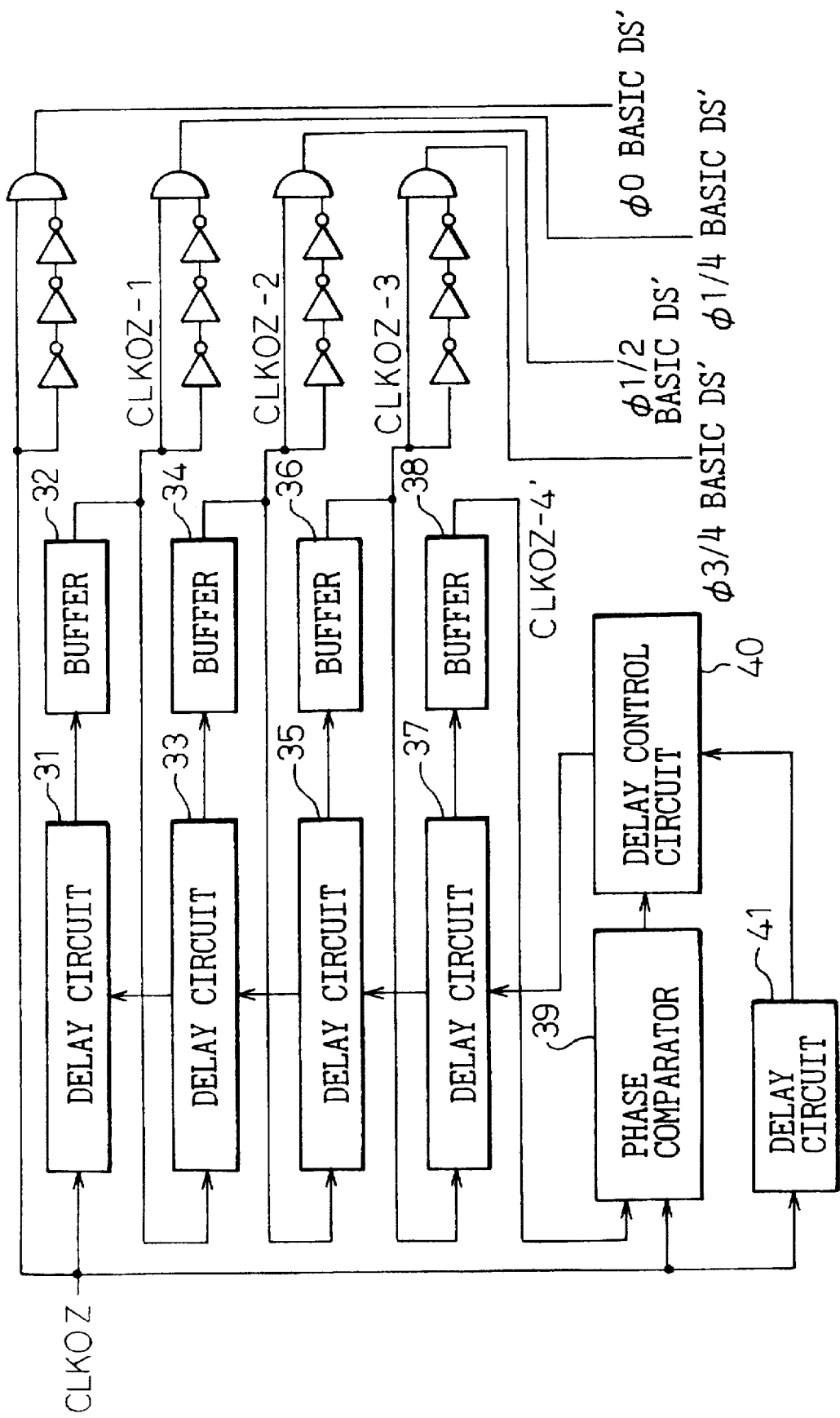
FIG. 16 is a diagram showing the configuration of a modified example of the phase shift basic DS generating circuit of the first embodiment.
Figure 17:
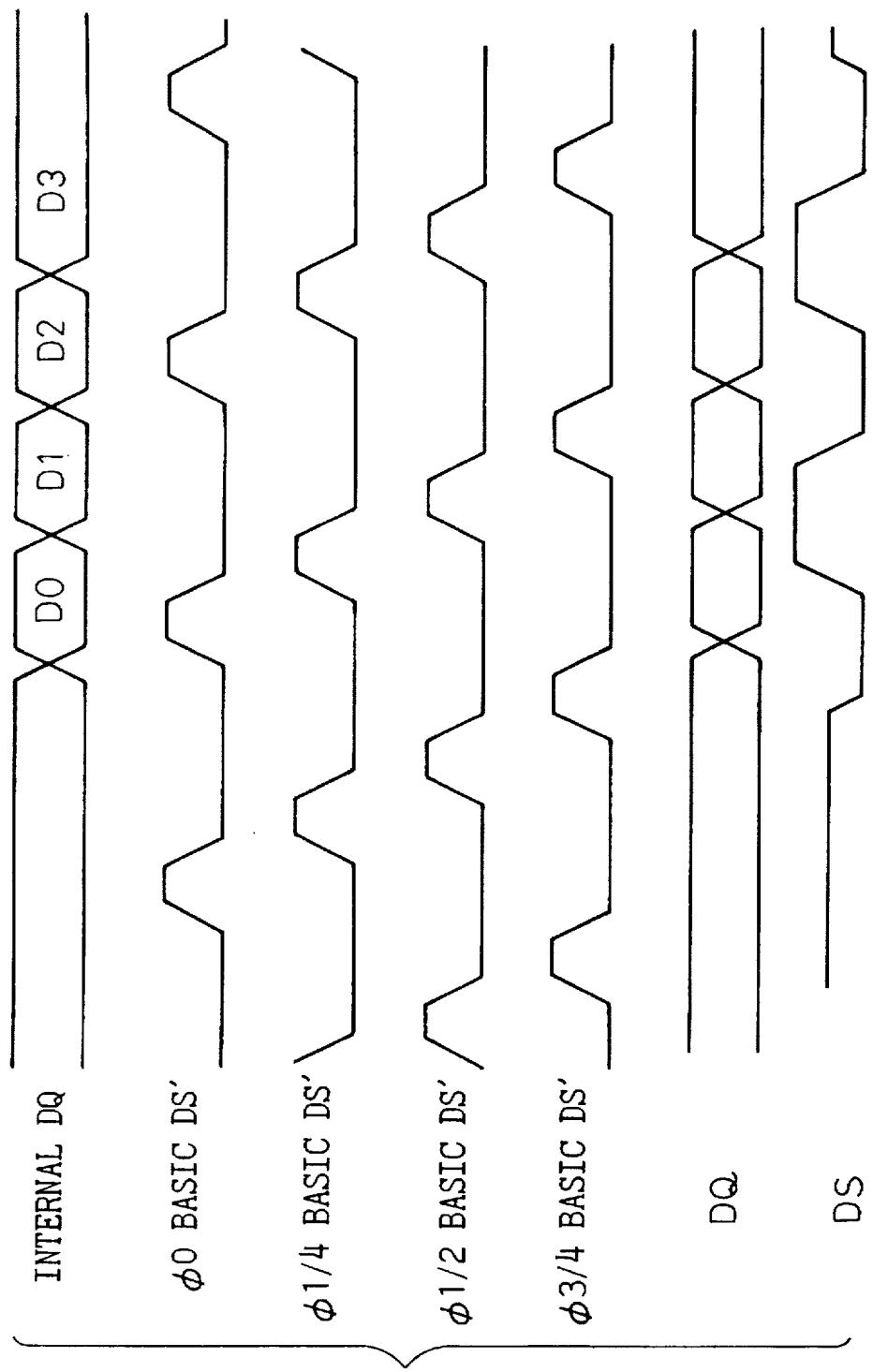
FIG. 17 is a diagram illustrating an output operation of the SDRAM in the modified example of the first embodiment.

In the first embodiment, the φ0 basic DS and φ¼ basic DS of a frequency twice that of the clock CLK, as shown in FIG. 15, are generated by the phase shift basic DS generating circuit, but it will be easier to increase the margin if the same frequency as that of the clock CLK is used. In view of this, in a modified example of the first embodiment, the phase shift basic DS generating circuit is configured so that the four pulses generated by the circuits, each consisting of the three inverters and AND gate, are output as φ0 basic DS', φ¼ basic DS', φ½ basic DS', and φ¾ basic DS', respectively, as shown in FIG. 16. In this case, the φ0 basic DS' and φ½ basic DS' are supplied to the data output buffer 26, and the φ¼ basic DS' and φ¾ basic DS' are supplied to the DS output buffer 29. FIG. 17 is a diagram illustrating an output operation in this modified example.

Figure 18:
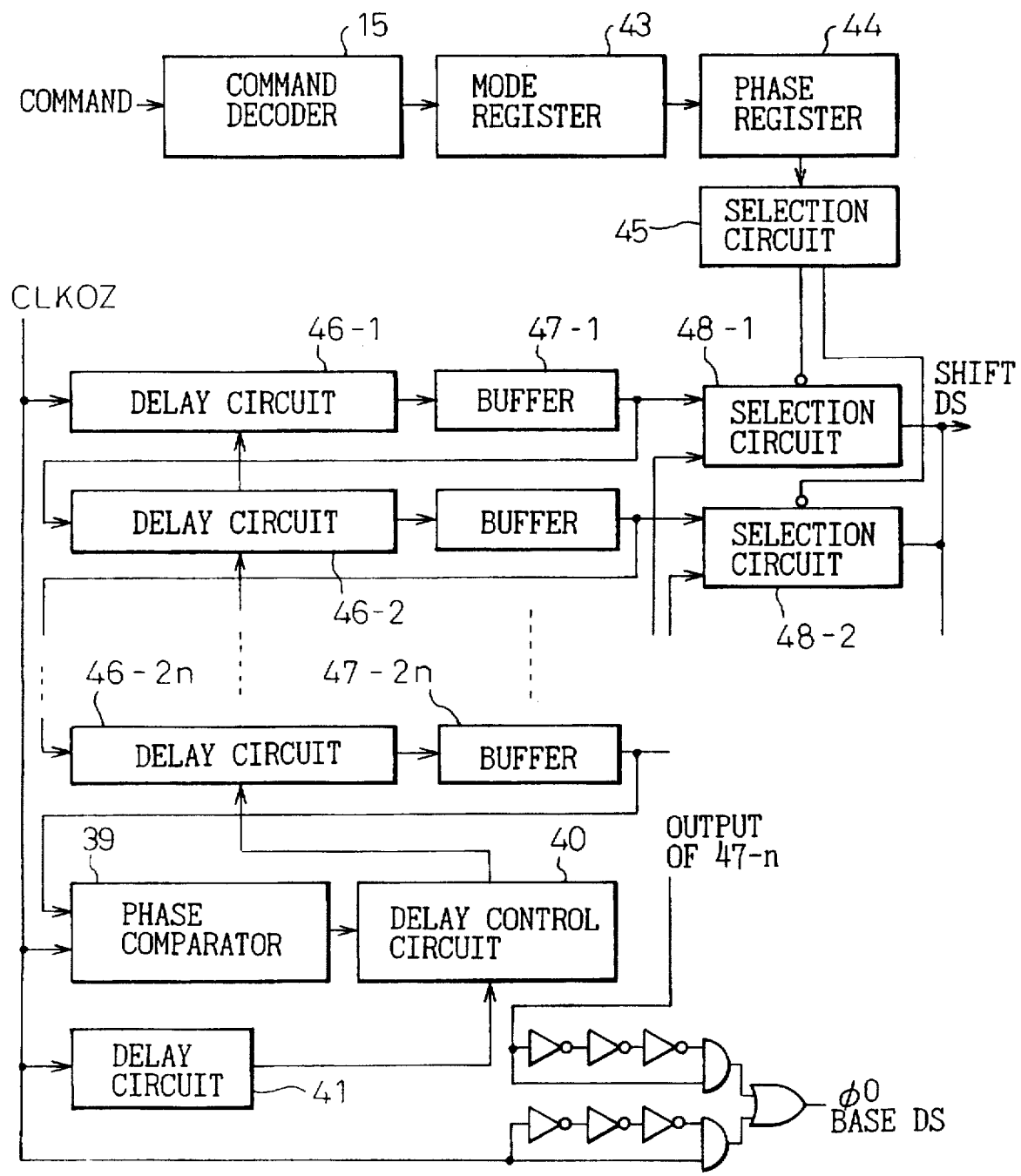
FIG. 18 is a diagram showing the configuration of a phase shift basic DS generating circuit according to a second embodiment of the present invention.

FIG. 18 is a diagram showing the configuration of a phase shift basic DS generating circuit in a semiconductor device according to a second embodiment of the present invention. As shown, a number, 2n, of delay circuit/buffer circuit pairs are provided; therefore, when the output of the final stage is in phase with the synchronous internal clock CLKOZ, it follows that the signals from the respective stages are respectively shifted in phase by 360°/2n. Similarly to the first embodiment, pulse signals are generated from the CLKOZ and the input signal to the n-th stage, and these pulse signals are summed to produce the φ0 basic DS. When the outputs of the stages, shifted in phase by 180° with respect to each other, are combined and the resulting pulse signals are summed, latch signals shifted in phase by 180°/n are generated. Selection circuits 48-1 to 48-n-1 each include two circuit sets each consisting of three inverters, an AND gate, and an OR gate, and are configured so that whether the signal from the OR gate should be output or not can be selected according to the select signal supplied from a selection circuit 45.

The SDRAM is constructed so that its operation mode can be set in accordance with a command from the controller, and for that purpose, a mode register 43 is provided that identifies the mode from the output of a command decoder 15. In the second embodiment, a mode for setting the phase of the data strobe signal DS relative to the input data DQ is included in the modes stored in the mode register 43. In response to an input specifying the phase setting mode, the mode register 43 supplies data specifying which of the phases respectively shifted by 180°/n is to be selected, to a phase register 44 which then stores this value and supplies it to the selection circuit 45. The selection circuit 45 selects one of the selection circuits 48-1 to 48-n-1 in accordance with the supplied value, and the signal from the selected selection circuit is output as shift DS. This shift DS is applied to the DS output buffer. With this configuration, the phase of the data strobe signal DS relative to the output data signal DQ can be set as desired from the controller side.

As described above, according to the present invention, since the data strobe signal output from the semiconductor memory circuit can be set at a prescribed phase angle with respect to the output data, there is no need to provide a delay circuit at the controller side; as a result, the margin associated with it can be eliminated, achieving a corresponding increase in speed.

What is claimed is:

1. A semiconductor memory system comprising:
   at least one semiconductor memory device; and
   a control device for inputting and outputting data from and to said semiconductor memory device,
   said control device outputting the data to said semiconductor memory device, synchronously with a first synchronizing signal that said control device outputs,
   said semiconductor memory device outputting the data to said control device synchronously with a second synchronizing signal that said semiconductor memory device outputs, and
   said semiconductor memory device including an output phase shift circuit for keeping a prescribed phase angle between the data from the semiconductor memory device and said second synchronizing signal.

2. A semiconductor memory system according to claim 1, wherein said second synchronizing signal is a signal with a 50% duty cycle.

3. A semiconductor memory system according to claim 2, wherein said semiconductor memory device delivers the data twice during one cycle of said second synchronizing signal.

4. A semiconductor memory system according to claim 3, wherein said second synchronizing signal is shifted in phase with respect to the data from the semiconductor memory device by 90 degrees and 270 degrees, respectively.

5. A semiconductor memory system according to claim 1, wherein said output phase shift circuit is capable of adjusting the phase difference between the data from the semiconductor memory device and said second synchronizing signal among a plurality of set values.

6. A semiconductor memory system according to claim 5, wherein the phase difference between data from the semiconductor memory device and said second synchronizing signal can be set from said control device.

7. A semiconductor memory system according to claim 6, wherein said control device, in accordance with said second synchronizing signal latched therein, immediately issues a request to set said prescribed phase angle in such a manner as to be suitable for latching the data from said semiconductor memory device.

8. A semiconductor memory system according to claim 6, wherein
   said semiconductor memory device includes a mode register for storing a plurality of control values corresponding to the plurality of phase difference values defining the phase difference between the data from the semiconductor memory device and said second synchronizing signal, and for selecting and outputting one of said control values in accordance with a command signal from said control device, and
   said output phase shift circuit adjusts the phase difference between the data from the semiconductor memory device and said second synchronizing signal, based on said control value output from said mode register.

9. A semiconductor memory system according to claim 1, wherein said semiconductor memory device includes
   a basic second synchronizing signal generating circuit for generating a basic second synchronizing signal which is used to generate said second synchronizing signal from said first synchronizing signal latched therein, and
   a data output circuit for delivering the data synchronously with said basic second synchronizing signal, and wherein
   said output phase shift circuit delays said basic second synchronizing signal by said prescribed angle.

10. A semiconductor memory system according to claim 9, wherein said semiconductor memory device includes an external synchronizing phase adjusting circuit for adjusting the phase of said latched first synchronizing signal so that said latched first synchronizing signal is in phase with said first synchronizing signal.

11. A semiconductor memory system according to claim 9, wherein said semiconductor memory device includes a phase shift/basic second synchronizing signal generating circuit integrating said basic second synchronizing signal generating circuit with said output phase shift circuit.

12. A semiconductor memory device, comprising:
   a data output circuit for outputting data synchronously with a basic output synchronizing signal;
   an output phase shift circuit for generating a shifted output synchronizing signal having a prescribed phase angle against said basic output synchronizing signal; and an output synchronizing signal output circuit for outputting said shifted output synchronizing signal.

13. A semiconductor memory device according to claim 12, wherein said output synchronizing signal is a signal with a 50% duty cycle.

14. A semiconductor memory device according to claim 13, wherein said semiconductor memory device delivers output data twice during one cycle of said output synchronizing signal.

15. A semiconductor memory device according to claim 14, wherein said output synchronizing signal is shifted in phase with respect to said output data by 90 degrees and 270 degrees, respectively.

16. A semiconductor memory device according to claim 12, wherein said output phase shift circuit is capable of adjusting the phase difference between said output data and said output synchronizing signal among a plurality of set values.

17. A semiconductor memory device according to claim 16, wherein the phase difference between said output data and said output synchronizing signal can be set externally.

18. A semiconductor memory device according to claim 17, including
a mode register for storing a plurality of control values corresponding to the plurality of phase difference values defining the phase difference between said output data and said output synchronizing signal, and for selecting and outputting one of said control values in accordance with a command signal from said control device, wherein
said output phase shift circuit adjusts the phase difference between said output data and said output synchronizing signal, based on said control value output from said mode register.

19. A semiconductor memory device according to claim 12, including
a basic output synchronizing signal generating circuit for generating a basic output synchronizing signal which is used to generate said output synchronizing signal from an externally input synchronizing signal latched therein, wherein
said data output circuit delivers said output data synchronously with said basic output synchronizing signal,
said output phase shift circuit delays said basic output synchronizing signal by said prescribed angle, and
said output synchronizing signal output circuit outputs said output synchronizing signal synchronously with said basic output synchronizing signal delayed through said output phase shift circuit.

20. A semiconductor memory device according to claim 19, including an external synchronizing phase adjusting circuit for adjusting the phase of said latched externally input synchronizing signal so that said latched externally input synchronizing signal is in phase with said output synchronizing signal.

21. A semiconductor memory device according to claim 19, including a phase shift/basic output synchronizing signal generating circuit integrating said basic output synchronizing signal generating circuit with said output phase shift circuit.

* * * * *